(12) United States Patent
Arana et al.

(10) Patent No.: US 7,528,006 B2
(45) Date of Patent: May 5, 2009

(54) INTEGRATED CIRCUIT DIE CONTAINING PARTICLE-FILLED THROUGH-SILICON METAL VIAS WITH REDUCED THERMAL EXPANSION

(75) Inventors: Leonel Arana, Phoenix, AZ (US); Michael Newman, Gilbert, AZ (US); Devendra Natekar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 298 days.

(21) Appl. No.: 11/174,125

(22) Filed: Jun. 30, 2005

(65) Prior Publication Data
US 2007/0001266 A1   Jan. 4, 2007

(51) Int. Cl.
*H01L 21/44* (2006.01)
(52) U.S. Cl. ............... 438/106; 438/107; 438/110; 257/E21.499
(58) Field of Classification Search ............ 438/106, 438/107, 110, 612
See application file for complete search history.

(56) References Cited

U.S. PATENT DOCUMENTS

2004/0021139 A1   2/2004   Jackson et al.
2004/0159551 A1*  8/2004   Barcell .................. 205/109
2005/0082676 A1   4/2005   Andry et al.
2005/0121768 A1   6/2005   Edelstein et al.
2005/0148164 A1   7/2005   Casey et al.
2005/0189136 A1*  9/2005   Kawasaki et al. ........ 174/255

OTHER PUBLICATIONS

Anthony T. R.: "Forming Electrical Interconnections through Semiconductor Wafers" Journal of Applied Physics, American Institute of Physics. New York, US, vol. 52, No. 8, Aug. 1981, pp. 5340-5349, XP000891551 ISSN: 0021-8979.
International Search Report and Written Opinion for PCT/US2006/025748 mailed Nov. 7, 2006, 11 pages.
International Preliminary Report on Patentability for PCT/US2006/025748 mailed Jan. 17, 2008, 7 pages.

* cited by examiner

*Primary Examiner*—Thanh Nguyen
(74) *Attorney, Agent, or Firm*—Kenneth A. Nelson (57) ABSTRACT

A method, apparatus and system with an electrically conductive through hole via of a composite material with a matrix forming a continuous phase and embedded particles, with a different material property than the matrix, forming a dispersed phase, the resulting composite material having a different material property than the matrix.

12 Claims, 9 Drawing Sheets

| Material | Composition | CTE, μm/m/°C | Electrically conductive? | Notes | Reference |
|---|---|---|---|---|---|
| Copper | Cu | 16.5 | Yes | Commonly used via material | www.webelements.com |
| Invar 36 Alloy | Ni 36%, Mn 0.35%, Si 0.2%, C 0.02%, Fe bal | 1.3 to 4.2 (90-260°C) | Yes | Ferromagnetic | www.cartech.com |
| Super Invar | Ni 32%, Co 5.5%, Mn 0.4%, Si 0.25%, C 0.02%, Fe bal) | 0.63 (-55 to 95°C) | Yes | Ferromagnetic | www.cartech.com |
| Kovar | Ni 29%, Co 17%, Mn 0.3%, Si 0.2%, C 0.02%, Fe bal) | 5.1 (25-300°C) | Yes | Ferromagnetic | www.cartech.com |
| Silica | $SiO_2$ | ~3 (25-250 °C) | No | Commonly used filler | www.matweb.com |
| Tungsten | W | 4.5 | Yes | Common in IC manufacturing | www.webelements.com |

[1] Maxwell, James Clerk. A Treatise on Electricity and Magnetism, 3rd Edition. Dover Publications, Inc. 1954.

FIG. 20

INTEGRATED CIRCUIT DIE CONTAINING PARTICLE-FILLED THROUGH-SILICON METAL VIAS WITH REDUCED THERMAL EXPANSION

TECHNICAL FIELD

The invention relates to the field of microelectronics and more particularly, but not exclusively, to stacked packages and electrically conductive through silicon vias.

BACKGROUND

The evolution of integrated circuit designs has resulted in higher operating frequency, increased numbers of transistors, and physically smaller devices. This continuing trend has generated ever-increasing area densities of integrated circuits. To further increase possible densities of integrated circuits, it may be desirable in some instances to electrically couple an active circuit layer on a die to another active circuit layer on the same, or a different, die by means of an electrically conductive through silicon via. A typical through silicon via may simply be a void within a bulk silicon portion of a die filled with a bulk material of approximately uniform composition, for example an alloy of copper.

Many materials may undergo a physical expansion or contraction resulting from a change in temperature. A coefficient of thermal expansion (CTE) may represent a change in unit volume of a bulk material for a unit change in temperature. If a volume of a first bulk material encloses a second volume of a second bulk material with different coefficient of thermal expansion from the first bulk material with zero stress at a given temperature, a change in temperature may cause a non-zero stress to develop at an interface of the different bulk materials. In some cases, under a sufficient change in temperature, or a sufficient number of temperature excursion cycles, a stress at an interface of the different bulk materials may exceed a certain critical stress and cause a permanent deformation or dislocation in one or the other or both bulk materials. Alternatively, performance of the integrated circuit device may degrade from an increased stress at an interface of different bulk materials, without either material undergoing a permanent deformation or dislocation.

During a normal manufacturing cycle, packages containing integrated circuits may undergo various processes, some of which may occur at an elevated temperature. For example, a package containing integrated circuits may undergo, for example, a solder reflow process, after perhaps being at room temperature. In a solder reflow process, various components within the package, including the integrated circuits and accompanying bulk silicon to which the integrated circuits may be coupled may approach, or even exceed a temperature at which a solder reflows, e.g., perhaps 230° C. for a representative Pb-free solder, contrasting with a normal storage temperature, for example, perhaps 25° C. In the present example, a package and its components may undergo a significant temperature change, e.g. based on the present example, as much or greater than 205° C.

Further, under normal operation, integrated circuits such as processors generate heat that may cause various components within a package, including the integrated circuits and accompanying bulk silicon to which the integrated circuits may be coupled, to undergo temperature variations. While temperature excursions under normal operation may not be as extreme as those experienced in a manufacturing process, throughout a product's design life, a package and its components including the integrated circuits and accompanying bulk silicon to which the integrated circuits may be coupled may undergo a high number of temperature excursions resulting from normal operation.

Copper has a bulk linear CTE of approximately 16.5 ppm/° C. in contrast to silicon, which has a bulk linear CTE of approximately 2.6 ppm/° C. Thus, a unit volume of copper expands considerably more than a unit volume of silicon. Because a typical through silicon via may simply be a void in a bulk silicon portion of an integrated circuit die filled with an alloy of copper and the CTE of each material is almost an order of magnitude different, a mechanical stress may be induced at a copper—silicon interface when the package undergoes a temperature excursion.

Figure 1:
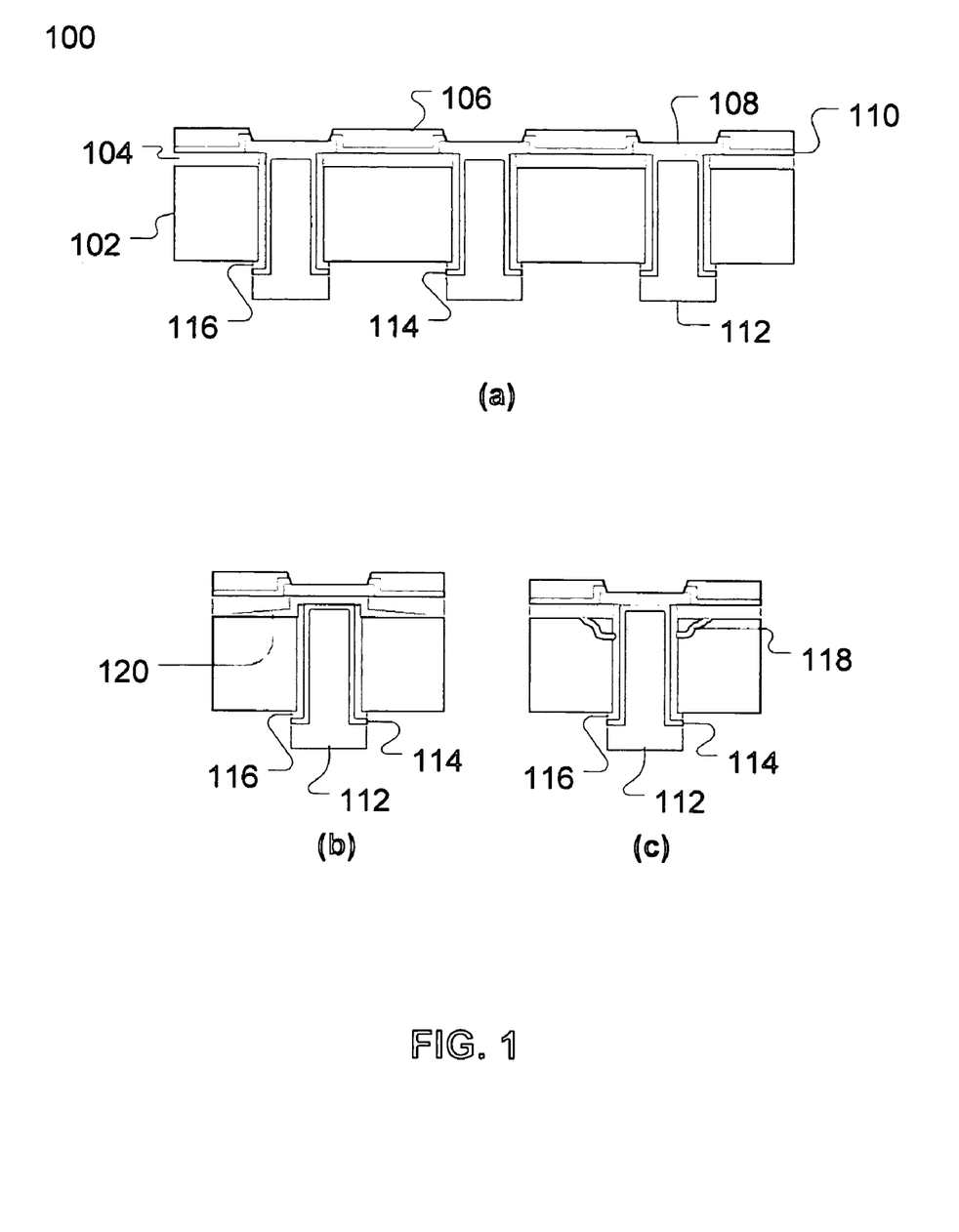
FIG. 1 illustrates a representation of prior art through silicon vias made of a single phase bulk material (FIG. 1(a)) leading to delamination (FIG. 1(b)) and die cracking (FIG. 1(c)).

For example, FIG. 1(a) represents a group of prior art through silicon vias, showing a portion of a bulk silicon die with integrated circuits 100. Prior art through silicon vias 112 may be electrically coupled to metal pads 108 through an electrically conductive seed layer 114. Between an electrically conductive seed layer 114 and a portion of the bulk silicon die 102 may be a passivation or electrical insulation layer 116. Metal pads 108 and a portion of the bulk silicon die 102 may be separated by an interlayer dielectric (ILD) material 104. A layer of ILD 104 coupled to a portion of the bulk silicon die 102 between metal pads 108 may underlie a layer of passivation material 110 or a protection layer 106. FIG. 1(b) and FIG. 1(c) represent a prior art through silicon via suffering stress induced, mechanical failures of delamination 120 and die cracking 118, respectively. A prior art through silicon via may have a bulk CTE substantially similar in magnitude to the bulk CTE of the continuous metal phase and substantially different from the bulk CTE of silicon, leading to significant principal stresses under temperature excursions. The significant principal stresses in turn may cause mechanical failures of the integrated circuit such as delamination 120 or die cracking 118. Further, significant principal stresses, without causing delamination 120 or die cracking 118 may cause degraded performance within an integrated circuit.

To maintain a mechanical stress resulting from a CTE mismatch below a critical stress of either bulk material for a given temperature excursion, via size may be reduced, spacing between adjacent vias may be increased, or vias may be positioned far from active circuitry. Each of these solution options may lead to increased die size, lower density circuits than may otherwise be realized or increased cost per die.

DETAILED DESCRIPTION

Herein disclosed are methods, apparatuses, and systems for providing a through silicon via with a desirable bulk coefficient of thermal expansion. In the following detailed description, reference is made to the accompanying drawings which form a part hereof wherein like numerals designate like parts throughout, and in which is shown by way of illustration specific embodiments which may be practiced. It is to be understood that other embodiments may be utilized and structural or logical changes may be made without departing from the scope of the claims presented herein. It should also be noted that directions and references (e.g., up, down, top, bottom, primary side, backside, etc.) may be used to facilitate the discussion of the drawings and are not intended to restrict the breadth of application of the claims presented. Therefore, the following detailed description is not to be taken in a limiting sense and the scope of possible embodiments is defined only by the appended claims and their equivalents.

Figure 2:
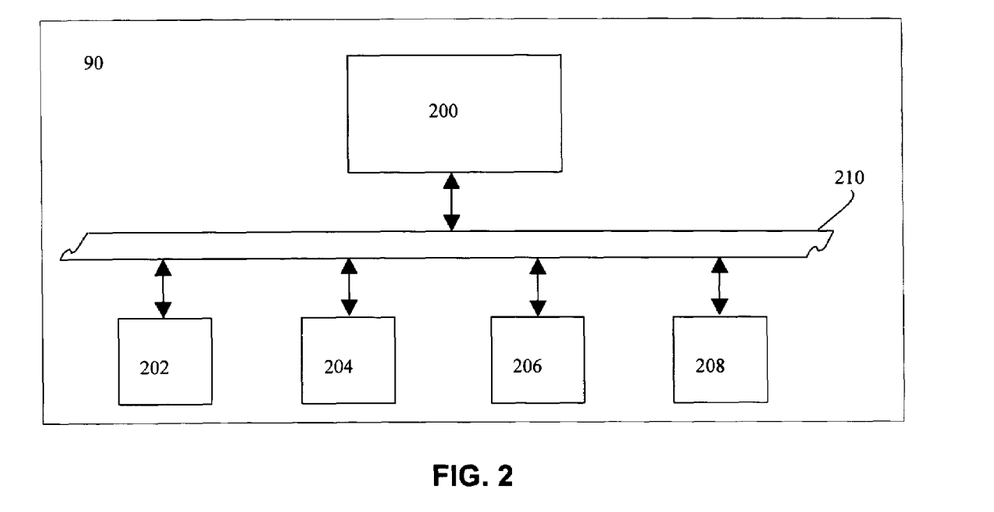
FIG. 2 illustrates one embodiment of a system including an electronic package assembly having particle-filled through silicon vias with reduced thermal expansion.

Referring to FIG. 2, there is illustrated one of many possible systems in which embodiments presented may be used. The integrated circuit package 200 may contain a portion of a silicon die similar to the portion of a silicon die 600, 700, 800, 900, 1000, 1100, 1200, 1300, 1400, 1500, 1600, 1700, and 1800 depicted in FIG. 6-FIG. 18, respectively. In one embodiment, the integrated circuit package 200 may include a microprocessor. In an alternate embodiment, the integrated circuit package 200 may include an application specific IC (ASIC). Integrated circuits found in chipsets (e.g., graphics, sound, and control chipsets) or memory may also be packaged in alternate embodiments.

For the embodiment depicted by FIG. 2, the system 90 may also include a main memory 202, a graphics processor 204, a mass storage device 206, and an input/output module 208 coupled to each other by way of a bus 210, as shown. Examples of the memory 202 include but are not limited to static random access memory (SRAM) and dynamic random access memory (DRAM). Examples of the mass storage device 206 include but are not limited to a hard disk drive, a flash drive, a compact disk drive (CD), a digital versatile disk drive (DVD), and so forth. Examples of the input/output modules 208 include but are not limited to a keyboard, cursor control devices, a display, a network interface, and so forth. Examples of the bus 210 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, an audio/video controller, a DVD player, a network router, a network switching device, or a server.

Figure 3:
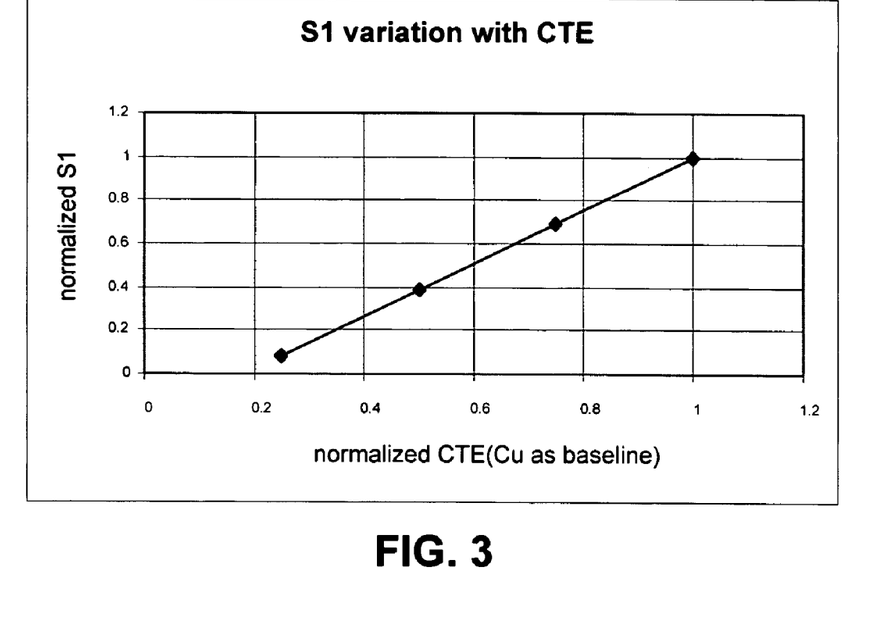
FIG. 3 illustrates a graph of normalized material stress variation with normalized coefficient of thermal expansion for a given array of through silicon vias.

FIG. 3 illustrates a graph of results from a finite element simulation of a first principal stress with a normalized bulk CTE (reference CTE is that of copper) of a material used to fill a 20 micron via in an array of vias with a 500 micron pitch. A normalized CTE of 0.16 represents silicon. The data of FIG. 3 shows the first principal stress may reduce as the via material's bulk CTE approaches that of silicon.

Figure 4:
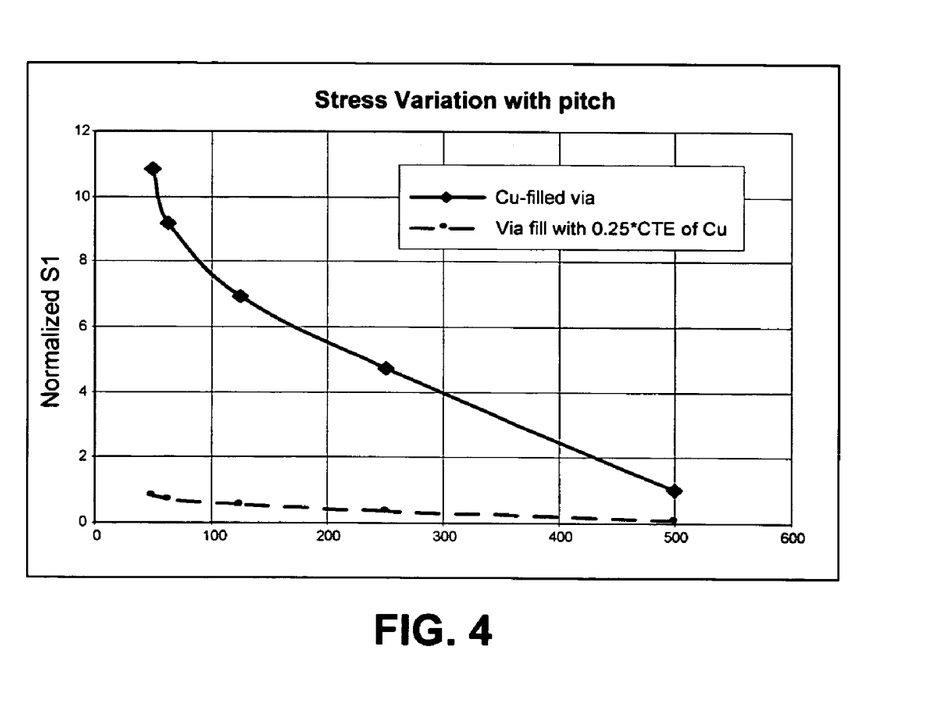
FIG. 4 illustrates a graph of normalized material stress variation with via array pitch for vias filled with pure copper and for vias filled with a bulk material with 25% of the CTE of pure copper.

FIG. 4 illustrates a graph of further finite element simulation showing a variation of a first principal stress with via pitch for a 20 micron pure copper via and a 20 micron via made of a material with a CTE 25% that of copper. The data of FIG. 4 shows the first principal stress may decrease significantly at small pitch if a bulk material with reduced CTE forms a via. Further, a reduced CTE via may result in a lower first principal stress, at smaller pitch, than a conventional CTE via at large pitch.

A dispersed phase of filler particles may alter one or more bulk material properties of a through silicon via. For example, a resulting electrical resistivity of a composite of a metal matrix forming a continuous phase and an embedded spherical filler forming a dispersed phase may be approximated by the expression, $$k_{composite} = \frac{2k_1 + k_2 + p(k_1 - k_2)}{2k_1 + k_2 - 2p(k_1 - k_2)} k_2,$$

where $k_{composite}$ represents the resulting bulk electrical resistivity, $k_1$ represents the bulk electrical resistivity of the spherical filler and $k_2$ represents the bulk electrical resistivity of the matrix metal and p represents the volume fraction of spherical filler to bulk composite volume.

Further, a resulting CTE of a composite of a metal matrix forming a continuous phase and an embedded spherical filler forming a dispersed phase may be approximated by the expression, $CTE_{composite} = p \cdot CTE_1 + (1-p)CTE_2$, where $CTE_{composite}$ represents the resulting bulk CTE, $CTE_1$ represents the bulk CTE of the spherical filler and $CTE_2$ represents the bulk CTE of the matrix metal and p again represents the volume fraction of spherical filler to bulk composite volume.

Figure 5:
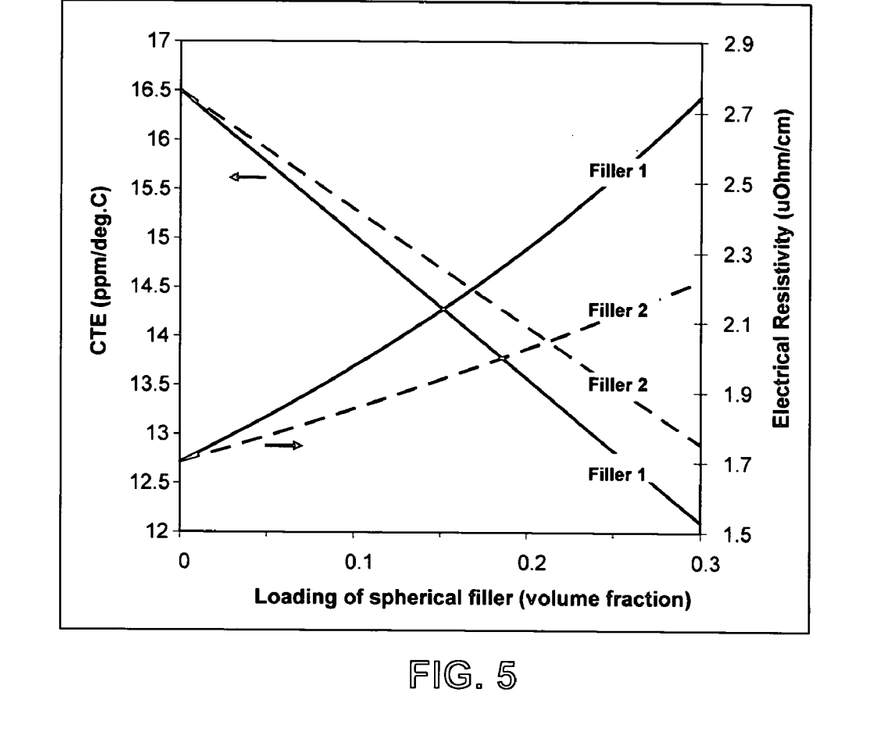
FIG. 5 illustrates variation of CTE and variation of Electrical Resistivity with volume fraction of embedded particles for two different filler materials.

FIG. 5 illustrates a graph showing an increased volume fraction of a spherical filler with CTE less than a matrix metal may monotonically decrease the bulk CTE of a resulting composite of matrix metal and embedded spherical filler. Further, FIG. 5 illustrates that increased volume fraction of a spherical filler with electrical resistivity greater than a matrix metal may monotonically increase the bulk resistivity of a resulting composite of matrix metal and embedded spherical filler. Still further, the data of FIG. 5 implies a choice of filler material may comprehend a tradeoff of reduced CTE with increased electrical resistivity. However, filler particle volume fractions may range up to more than 80%.

Although spherical particles are modeled for simplicity of calculation, spherical particles reduced to practice may be of arbitrary shape. Further, filler particles comprising the dispersed phase may be any one, or combination, of silica, alumina, boron nitride, tungsten, Invar, Super Invar, Kovar or other material with CTE less than the surrounding bulk die material through which the via passes, e.g., silicon. Still further, filler particles made of a ferromagnetic material, e.g., Invar, Super Invar and Kovar, may be used in a magnetic-field assisted electroplating process.

An embodiment may use one of many metals for the matrix. Exemplary matrix materials include copper (Cu), gold (Au), aluminum (Al), tungsten (W), silver (Ag) and both eutectic and non-eutectic solders. Exemplary eutectic solders include tin-lead (Pb/Sn) and gold-tin (Au/Sn) solders.

Figure 6:
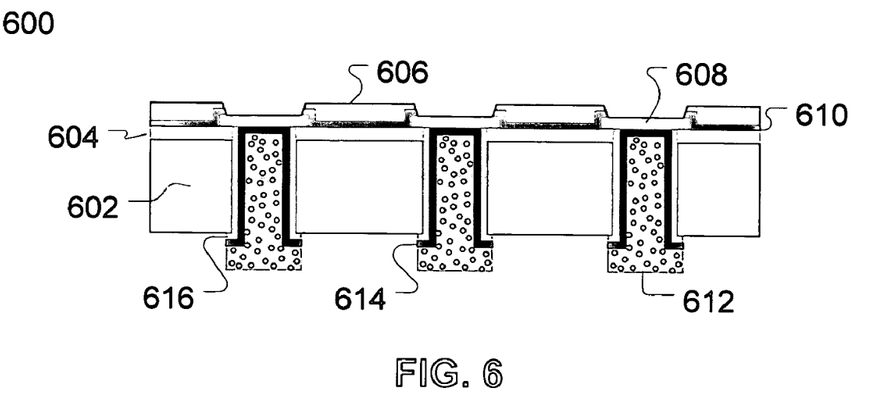
FIG. 6 illustrates an embodiment of electrically conductive through silicon vias made of a bulk material, the bulk material consisting of a matrix metal forming a continuous phase and embedded particles forming a dispersed phase.

FIG. 6 illustrates one embodiment of a portion of a die with integrated circuits 600. In one embodiment, through silicon vias 612 may be electrically coupled to metal pads 608 through an electrically conductive seed layer 614. In a further embodiment, the through silicon vias 612 may be a composite wherein the bulk CTE of the vias 612 is less than the bulk CTE of the matrix metal. In still a further embodiment, a reduced CTE through silicon via 612 may comprise a matrix metal forming a continuous phase and embedded particles with a CTE less than the matrix metal, the embedded particles forming a dispersed phase and the reduced CTE through silicon via 612 having a bulk CTE less than the bulk CTE of the matrix metal. Between an electrically conductive seed layer 614 and a portion of the bulk silicon die 602 may be a passivation or electrical insulation layer 616. Metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606.

FIG. 7-FIG. 18 illustrate articles undergoing a method to manufacture a via through a die containing integrated circuits.

Figure 7:
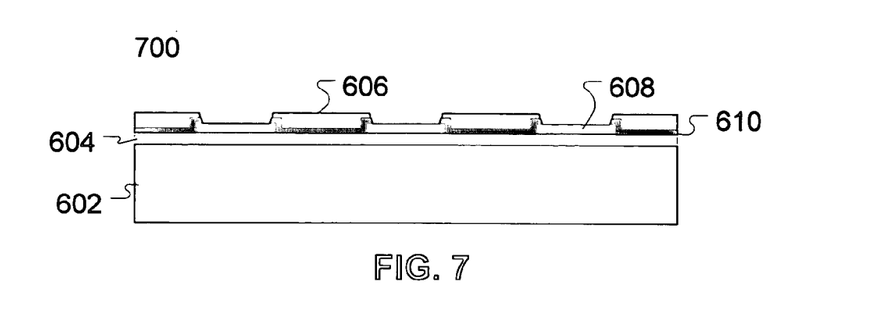
FIG. 7 illustrates a portion of a silicon die prior to applying.

FIG. 7 illustrates a substrate 700 to which a method of manufacture may be applied. Metal pads 608 and a portion of a die 602 may be separated by an interlayer dielectric (ILD) material 604. In one embodiment, the die 602 may be silicon. In still a further embodiment, a layer of ILD 604 coupled to a portion of the bulk silicon die 602 between metal pads 608 may underlie a layer of passivation material 610 or a protection layer 606.

Figure 8:
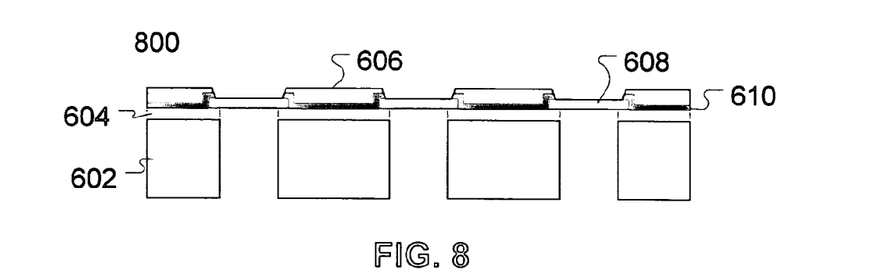
FIG. 8 illustrates the portion of a silicon die of FIG. 7 with several areas of bulk silicon removed.

FIG. 8 illustrates the substrate of FIG. 7 wherein a portion of a die with integrated circuits 800 has material removed in a vicinity near a metal pad 608. In one embodiment, the die 602 may be silicon. Removal of die material may be by photolithography followed by a dry or wet etching process. Alternatively, removal may be by a micromachining technique. In one embodiment, a micromachining technique may be blasting, drilling, or another micromachining technique, or a combination thereof Further, a portion of the ILD 604 in a vicinity near a metal pad may similarly be removed. As in FIG. 7, metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606.

Figure 9:
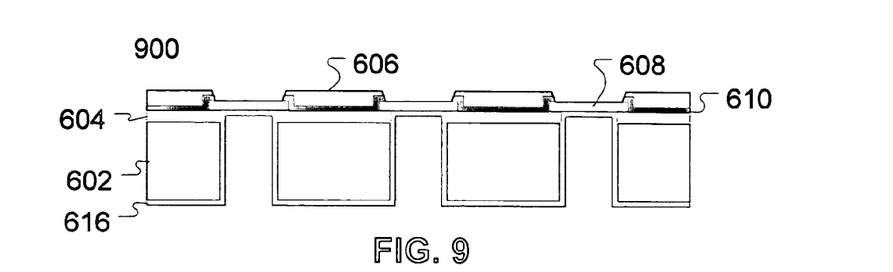
FIG. 9 illustrates the portion of a silicon die of FIG. 8 with a first layer of material deposited on a surface of the bulk silicon and an underside of a metal pad.

FIG. 9 illustrates the substrate of FIG. 8 during manufacture showing a portion of a die with integrated circuits 900. In FIG. 9, a layer of material 616 may be deposited on the surface of the die 602. In one embodiment, the die 602 may be silicon. The layer of material 616 may be a passivation layer. Alternatively, the layer of material 616 may be an electrical insulation material. As in previous figures, metal pads 608 and a portion of the bulk silicon die 602 may be separated by an interlayer dielectric (ILD) material 604. A layer of ILD 604 coupled to a portion of the die 602 between metal pads 608 may underlie a layer of passivation material 610 or a protection layer 606.

Figure 10:
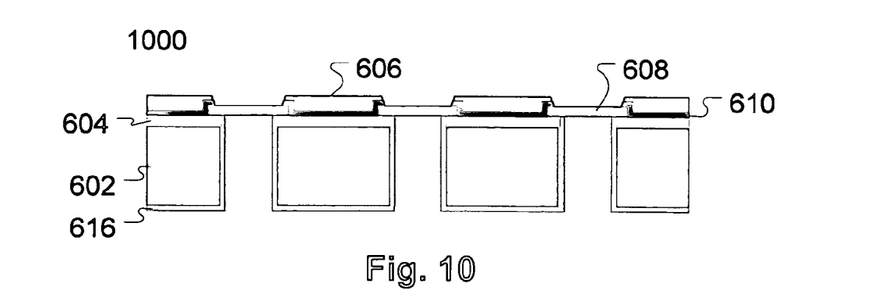
FIG. 10 illustrates the portion of a silicon die of FIG. 9 after exposing the metal pads through partial removal of the first layer of material deposited.

FIG. 10 illustrates the substrate of FIG. 9 undergoing manufacture, showing a portion of a die with integrated circuits 1000. In FIG. 10, a layer of material 616 proximate to a metal pad 608 may be removed, re-exposing a previously exposed metal pad 608. As in previous figures, the die 602 may be silicon and the metal pads 608 and a portion of the die 602 may be separated by an interlayer dielectric (ILD) material 604. A layer of ILD 604 coupled to a portion of the bulk silicon die 602 between metal pads 608 may underlie a layer of passivation material 610 or a protection layer 606.

Figure 11:
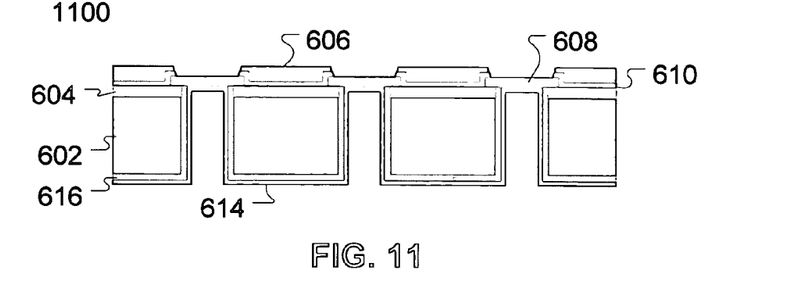
FIG. 11 illustrates the portion of a silicon die of FIG. 10 with a second layer of material deposited over the exposed metal pads and first layer of material.

FIG. 11 illustrates a portion of the substrate of FIG. 10 with integrated circuits 1100 with a second layer of material 614 deposited on the surface of the previously deposited layer of material 616. The second layer of material 614 may be a barrier layer. Alternatively, the layer of material 614 may be a seed layer to facilitate a later electroplating process. As in previous figures, metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606.

Figure 12:
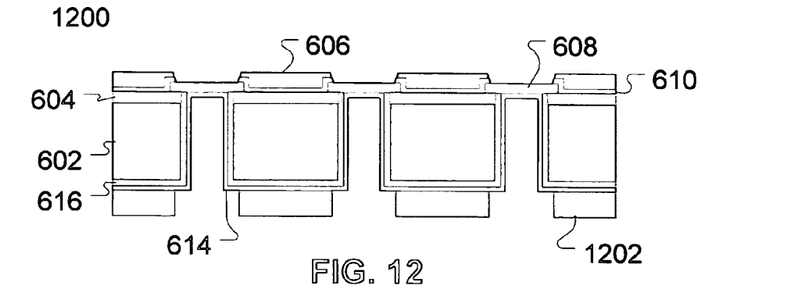
FIG. 12 illustrates the portion of a silicon die of FIG. 11 with photoresist applied.

FIG. 12 illustrates the substrate of FIG. 11 with integrated circuits 1200 and a pattern of photoresist 1202 deposited on the surface of the previously deposited layer of material 614. As in previous figures, a layer of material 616 may overlie the bulk silicon die 502 and underlie a second layer of material 614. Metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606.

Figure 13:
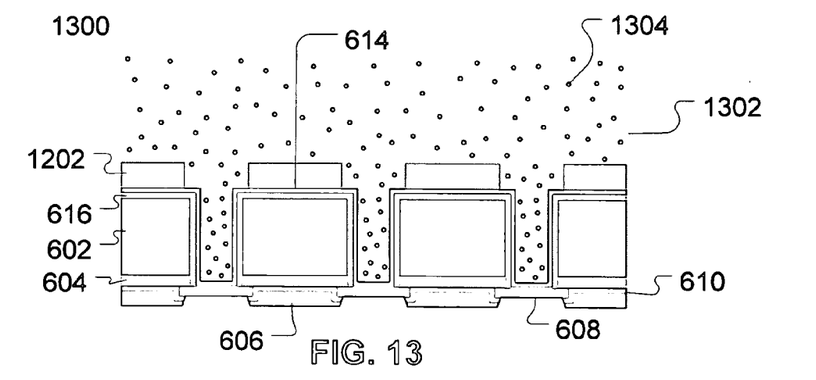
FIG. 13 illustrates the portion of a silicon die of FIG. 12 immersed in an electrolysis bath with dispersed particles.

FIG. 13 illustrates the substrate of FIG. 12 showing a portion of a die with integrated circuits 1300. In FIG. 13, an electroplating bath 1302 may contain in solution or suspension particles 1304 of reduced CTE relative to a deposited matrix metal. As in previous figures, a layer of material 616 may overlie the bulk silicon die 602 and underlie a second layer of material 614. Metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606 and a pattern of photoresist 1202 may be further present.

Figure 14:
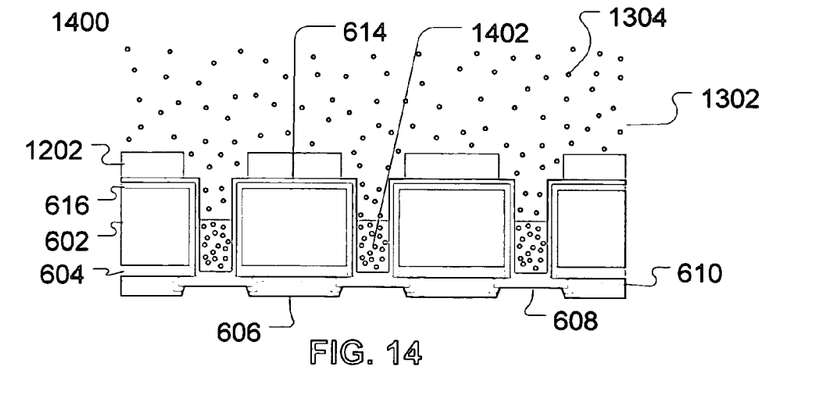
FIG. 14 illustrates the portion of a silicon die of FIG. 13 with partially deposited through silicon vias with dispersed particles.

FIG. 14 illustrates the substrate of FIG. 13 with integrated circuits 1400 immersed in an electroplating bath 1302. In FIG. 14, a portion of a via 1402 may be deposited within a void previously generated in the die 602. In one embodiment the via 1402 may be through silicon. In one embodiment, the die 602 may be silicon. An electroplating bath 1302 may contain in solution or suspension particles 1304 of reduced CTE relative to a deposited matrix metal. During the electroplating process, filler particles 1304 may be co-deposited in a portion of the reduced CTE through silicon via 1402. Further, to aid co-deposition of filler particles 1304, a driving potential may be applied. The driving force may be gravity, or some other driving potential made to act on the electroplating bath 1302 or filler particles 1304. As in previous figures, a layer of material 616 may overlie the bulk silicon die 602 and underlie a second layer of material 614. Metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606 and a pattern of photoresist 1202 may be further present.

Figure 15:
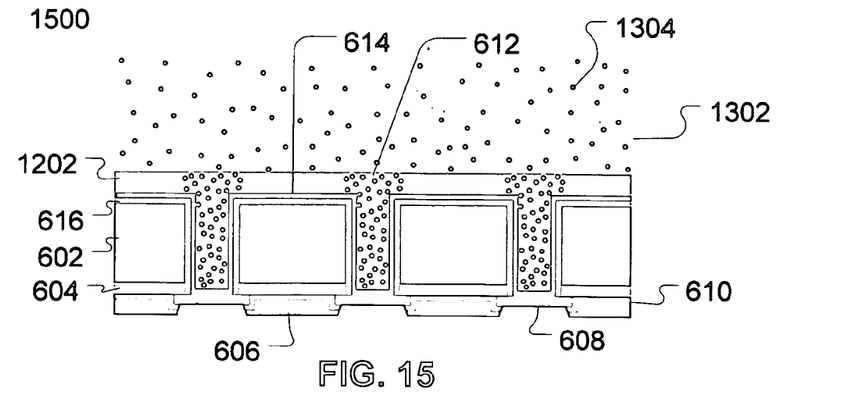
FIG. 15 illustrates the portion of a silicon die of FIG. 14 with fully deposited through silicon vias with dispersed particles.

FIG. 15 illustrates a portion of the substrate of FIG. 14 with integrated circuits 1500 immersed in an electroplating bath 1302. In FIG. 15, a reduced CTE via 612 may be fully deposited, the via being a composite comprising a metal matrix with greater CTE than the die 602, the metal matrix forming a continuous phase, and embedded filler particles with a CTE less than the CTE of the metal matrix, the filler particles forming a dispersed phase, the composite exhibiting a bulk CTE less than the bulk CTE of the matrix metal. In one embodiment, the die 602 is substantially silicon. As in previous figures, an electroplating bath 1302 may contain in solution or suspension particles 1304 of reduced CTE relative to a deposited matrix metal. During the electroplating process, filler particles 1304 may be co-deposited in a portion of the reduced CTE through silicon via 1402. Further, to aid co-deposition of filler particles 1304, a driving potential may be applied. The driving force may be gravity, or some other driving potential made to act on the electroplating bath 1302 or filler particles 1304. As in previous figures, a layer of material 616 may overlie the bulk silicon die 602 and underlie a second layer of material 614. Metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606 and a pattern of photoresist 1202 may be further present.

Figure 16:
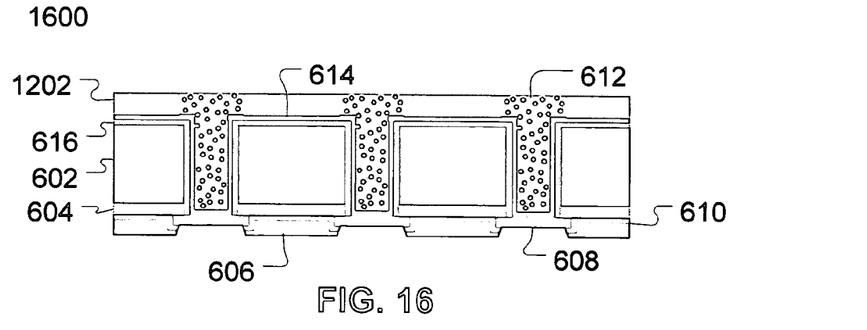
FIG. 16 illustrates the portion of a silicon die of FIG. 15 with the electrolysis bath removed.

FIG. 16 illustrates the substrate of FIG. 15, a portion of die with integrated circuits 1600 with the electroplating bath removed. As in previous figures, the die 602 may be silicon, a layer of material 616 may overlie the bulk silicon die 602 and underlie a second layer of material 614. Metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606 and a pattern of photoresist 1202 may be further present.

Figure 17:
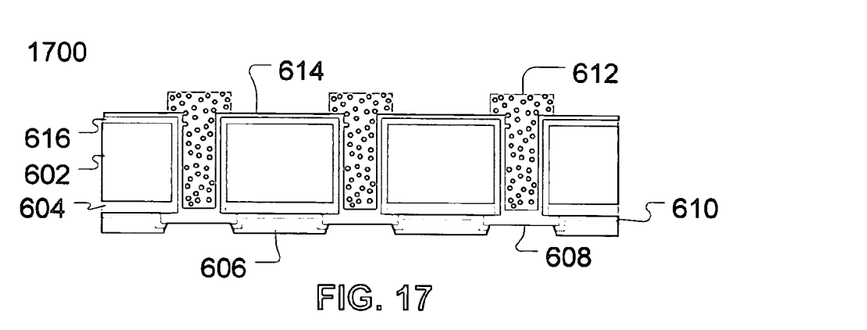
FIG. 17 illustrates the portion of a silicon die of FIG. 16 with the photoresist removed.

FIG. 17 illustrates the substrate of FIG. 16, showing a portion of die with integrated circuits 1700, the pattern of photoresist removed. As in previous figures, a layer of material 616 may overlie the bulk silicon die 602 and underlie a second layer of material 614. Metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606.

Figure 18:
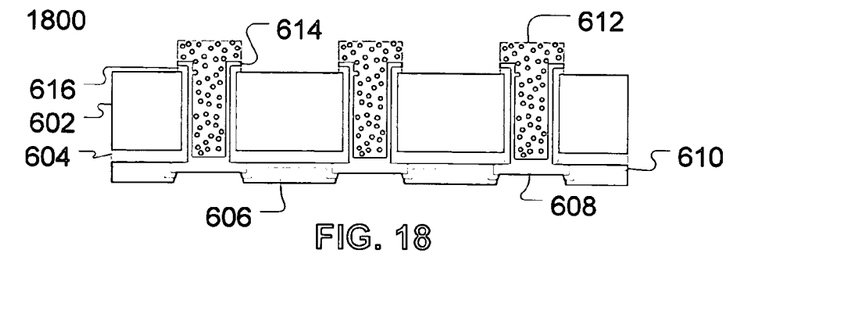
FIG. 18 illustrates the portion of a silicon die of FIG. 17 with the first and second layers of material removed in regions between the through silicon vias.

FIG. 18 illustrates the substrate of FIG. 17 showing a portion of bulk silicon die with integrated circuits 1800 and a first layer 614 and second layer 616 of material etched among the newly deposited vias 612, exposing a portion of die 602. The die 602 may be silicon. As in previous figures, a layer of material 616 may overlie the bulk silicon die 602 and underlie a second layer of material 614. Metal pads 608 and a portion of the bulk silicon die 602 may be separated by an interlayer dielectric (ILD) material 604. A layer of ILD 604 coupled to a portion of the bulk silicon die 602 between metal pads 608 may underlie a layer of passivation material 610 or a protection layer 606.

Figure 19:
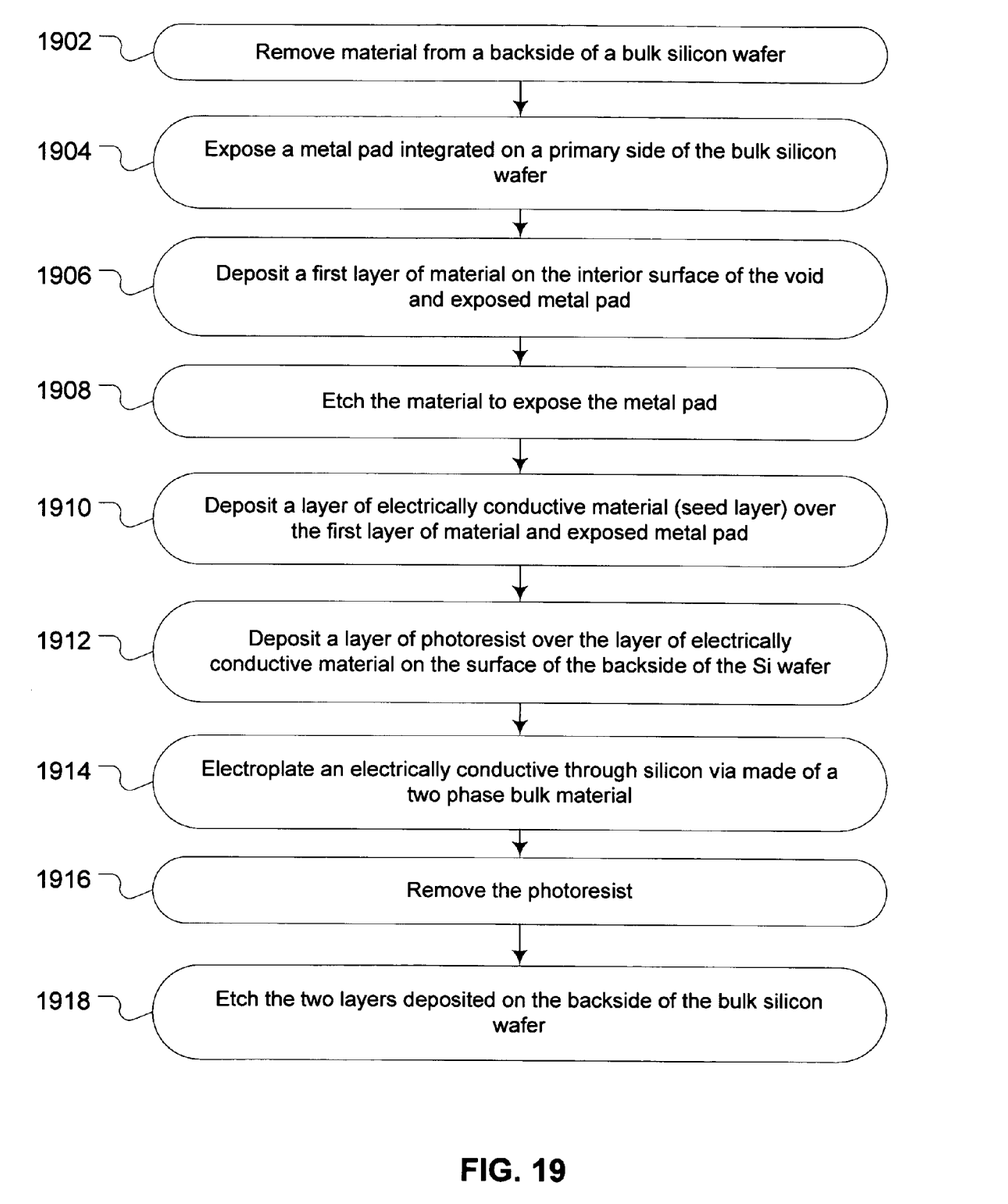
FIG. 19 illustrates a method of manufacture of reduced CTE through silicon vias.

FIG. 19 illustrates a method of forming through hole vias comprising a matrix and dispersed filler particles. In the method illustrated in FIG. 19, material may be removed 1902 from a backside of a bulk silicon wafer having a primary side and a backside A metal pad integrated on a primary side of the bulk silicon wafer may be exposed 1904. A first layer of material may be deposited on an exposed metal pad and an interior surface of the void within the bulk silicon wafer created by material removal 1906. The layer of material may be etched to expose a region of the metal pad 1908. A layer of electrically conductive material may be deposited over the exposed region of the metal pad and the previously deposited material 1910. A pattern of photoresist may be deposited over the layer of electrically conductive material 1912. An electroplating technique may be applied to deposit an electrically conductive through silicon via made of a two phase bulk material 1914, a continuous phase being a matrix metal and a dispersed phase being embedded filler particles. The pattern of photoresist may be removed 1916 and the two layers of material deposited on the backside of the bulk silicon wafer may be etched 1918.

Figure 20:
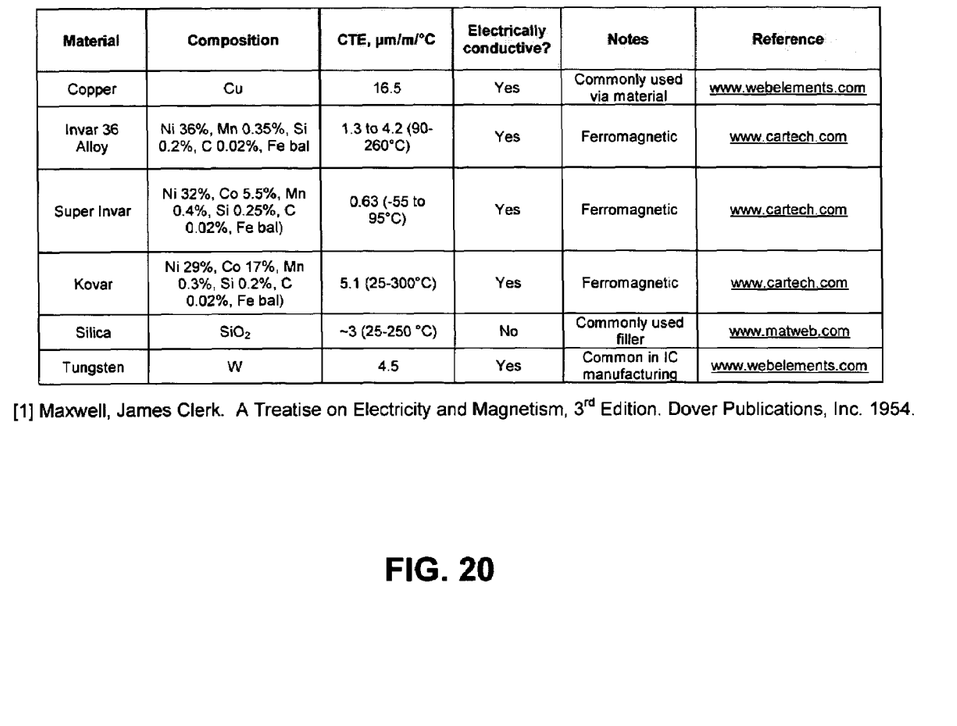
FIG. 20 illustrates a table of possible materials used to form a composite via.

FIG. 20 illustrates a partial list of materials, and several associated material properties, that may be used in one embodiment of a composite via.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope intended. For example, an alternative embodiment may exist where filler particles are packed into an open via hole within a die and a chemical vapor deposition (CVD) or physical vapor deposition (PVD) process (e.g., sputtering, evaporation, jet vapor deposition) may be used to fill in any volume in the through hole unfilled by packed particles. Yet another embodiment may exist wherein solder balls containing filler particles may reflow into an open via hole within a die. Still another embodiment may reflow solder balls containing filler particles under vacuum to avoid air filled voids within a finished via. Thus, those with skill in the art will readily appreciate implementation may be achieved using a very wide variety of embodiments. This application is intended to cover any adaptations or variations of the embodiments discussed herein. Therefore, it is manifestly intended only the claims and the equivalents thereof limit the scope of possible embodiments.

What is claimed is:

1. A method comprising:
    removing material from a die;
    forming in the die an electrically conductive via of an electrically conductive material different from the die, the electrically conductive material being a composite of an electrically conductive matrix forming a continuous phase and embedded particles forming a dispersed phase within the electrically conductive matrix.

2. The method of claim 1, wherein forming in the die an electrically conductive via further comprises one of the group consisting of electroplating, chemical vapor deposition (CVD), physical vapor deposition (PVD), sputtering, evaporation, jet vapor deposition, and reflowing solder containing filler particles.

3. The method of claim 2, wherein electroplating further comprises providing a driving potential to a first concentration of the embedded particles to cause a second concentration of the embedded particles in the material of the electrically conductive via.

4. The method of claim 3 wherein the second concentration of the embedded particles is greater than the first concentration of the embedded particles.

5. The method of claim 3 wherein the driving potential comprises one of the group consisting of gravity and a magnetic field.

6. The method of claim 1 wherein a bulk material of the electrically conductive via has a different material property than the matrix.

7. The method of claim 6 wherein the material property is a coefficient of thermal expansion, the material of the electrically conductive via having a lower coefficient of thermal expansion than the matrix.

8. The method of claim 1, wherein the matrix comprises a chosen one of the group consisting of copper (Cu), gold (Au), aluminum (Al), tungsten (W), silver (Ag), eutectic solder, and non-eutectic solder.

9. The method of claim 8, wherein the eutectic solder comprises one of the group consisting of tin-lead (Pb/Sn) solder and gold-tin (Au/Sn) solder.

10. The method of claim 1, wherein the embedded particles comprise a chosen one of the group consisting of silica, alumina, boron nitride, tungsten, Invar, Super Invar, and Kovar.

11. The method of claim 1, wherein the embedded particles comprise a ferromagnetic material.

12. A method comprising:

removing material from a silicon substrate;

forming in the silicon substrate an electrically conductive via of an electrically conductive material different from the silicon substrate, the electrically conductive material being a composite of an electrically conductive matrix forming a continuous phase and embedded particles forming a dispersed phase within the electrically conductive matrix.

* * * * *